(12) United States Patent
Gaspard et al.

(10) Patent No.: US 10,483,951 B2
(45) Date of Patent: Nov. 19, 2019

(54) TECHNIQUES FOR DETECTING AND CORRECTING ERRORS ON A RING OSCILLATOR

(71) Applicant: Altera Corporation, San Jose, CA (US)

(72) Inventors: Nelson Gaspard, San Jose, CA (US); Yanzhong Xu, Santa Clara, CA (US)

(73) Assignee: Altera Corporation, San Jose, CA (US)

(*) Notice: Subject to any disclaimer, the term of this patent is extended or adjusted under 35 U.S.C. 154(b) by 236 days.

(21) Appl. No.: 15/693,440

(22) Filed: Aug. 31, 2017

(65) Prior Publication Data

US 2017/0366174 A1    Dec. 21, 2017

Related U.S. Application Data

(63) Continuation of application No. 15/056,144, filed on Feb. 29, 2016, now Pat. No. 9,774,316.

(51) Int. Cl.
*H03K 3/66* (2006.01)
*G11C 11/00* (2006.01)
(Continued)

(52) U.S. Cl.
CPC .......... *H03K 3/66* (2013.01); *G11C 11/00* (2013.01); *G11C 11/419* (2013.01); *G11C 29/50* (2013.01); *H03B 5/12* (2013.01); *H03K 3/013* (2013.01); *H03K 3/03* (2013.01); *H03K 3/0315* (2013.01); *H03K 5/1252* (2013.01); *H03L 7/085* (2013.01)

(58) Field of Classification Search
CPC ............ H03K 3/03; H03K 3/66; H03K 3/013; H03K 3/0315; H03K 5/1252; H03B 5/12; H03L 7/085; G11C 11/00; G11C 29/50; G11C 11/419
USPC ........ 331/74, 1 A, 57, 16, 34; 327/141, 156, 327/159
See application file for complete search history.

(56) References Cited

U.S. PATENT DOCUMENTS 5,677,650 A    10/1997    Kwasniewski et al.
7,859,354 B1    12/2010    Chen et al.
(Continued)

OTHER PUBLICATIONS

Y. Chen, "Single-Event Characterization of Digitally Controlled Oscillators (DCOS)," Master Thesis, Vanderbilt University, 2014.
(Continued)

*Primary Examiner* — Arnold M Kinkead (57) ABSTRACT

A circuit may include a ring oscillator circuit and monitoring circuitry. The ring oscillator circuit has a group of inverters in a loop, whereby the group of inverters includes first, second, and third output nodes. The monitoring circuitry may monitor for error events in a signal that has passed through the inverters from any one of the first, second, or third output nodes, and may generate first and second monitoring circuitry outputs. The circuit may further include an error correction circuit that produces an error correction output based on the first and second monitoring circuitry outputs. Accordingly, the monitoring circuitry may generate first and second updated monitoring circuitry outputs based on the error correction output. The first and second updated monitoring circuitry outputs may be logically combined using a logic circuit to reset the signal that has passed through the loop.

20 Claims, 4 Drawing Sheets

(51) Int. Cl.
*G11C 29/50* (2006.01)
*G11C 11/419* (2006.01)
*H03B 5/12* (2006.01)
*H03K 3/013* (2006.01)
*H03K 3/03* (2006.01)
*H03L 7/085* (2006.01)
*H03K 5/1252* (2006.01)

(56) References Cited

U.S. PATENT DOCUMENTS

| | | |
|---|---|---|
| 9,088,288 B1 | 7/2015 | Rosen |
| 2007/0064470 A1* | 3/2007 | Takahashi .............. G11C 29/02 365/156 |
| 2007/0096836 A1 | 5/2007 | Lee et al. |
| 2014/0022022 A1* | 1/2014 | Choy ................. G01R 31/2824 331/57 |
| 2015/0311906 A1 | 10/2015 | Nilsson |
| 2016/0055921 A1 | 2/2016 | Jungmann et al. |

OTHER PUBLICATIONS

Korean Intellectual Property Office, International Search Report and Written Opinion of the ISA for international application PCT/US2017/016760, dated Apr. 28, 2017, pp. 1-12.
European Patent Office, Extended European Search Report for European patent application 17760451.9, dated Sep. 2, 2019, pp. 1-7.

* cited by examiner

TECHNIQUES FOR DETECTING AND CORRECTING ERRORS ON A RING OSCILLATOR

CROSS REFERENCE TO RELATED APPLICATION

This patent application is a continuation of U.S. patent application Ser. No. 15/056,144, filed Feb. 29, 2016, which is incorporated by reference herein in its entirety.

FIELD OF THE DISCLOSURE

The present disclosure relates to electrical circuits, and more particularly, to techniques for detecting and correcting errors on a ring oscillator.

BACKGROUND

Ring oscillators are used in a variety of circuit applications. For example, ring oscillators may be used in clock circuits and delay-locked-loop-type circuits. A conventional ring oscillator is formed from a loop of inverters. There may be, for example, hundreds of inverters in the ring oscillator, each of which has its output connected to the input of another one of the inverters. In some designs, a NAND gate may be inserted into the loop in place of one of the inverters. One of the NAND gate inputs may be used as an enable input. The ring oscillator may be enabled by asserting a trigger signal on the enable input. When the value of the trigger signal on the enable input is low, the ring oscillator will be turned off and will not oscillate. When the value of the trigger signal on the enable input is high, the ring oscillator will be enabled and will oscillate.

The trigger signals that are used for enabling and disabling ring oscillators in this way are generally produced using off-chip test equipment. As the trigger signal is routed to the enable input of the NAND gate through interconnects, the trigger signal can become degraded. In particular, a square wave trigger signal may pick up undesirable ringing characteristics due to parasitic circuit elements or due to power supply glitches. The spikes or other noise characteristics that are present in a trigger signal that has been degraded in this way may cause a ring oscillator to enter undesirable modes of operation in which higher-order harmonics propagate around the loop. When this occurs, the operation of the ring oscillator may be unstable or the output of the ring oscillator may oscillate at an undesired higher-order harmonic frequency rather than at an intended fundamental frequency.

SUMMARY

According to some embodiments of the present invention, techniques for detecting and correcting errors in a ring oscillator are provided. Embodiments of the present invention can be implemented in numerous ways, such as a process, an apparatus, a system, or a device. Several embodiments of the present invention are described below.

According to some embodiments, a circuit includes a ring oscillator circuit and monitoring circuitry. The ring oscillator circuit has a group of inverters in a loop, whereby the group of inverters includes first, second, and third output nodes. The monitoring circuitry monitors for an error event in a signal that has passed through the inverters from any one of the first, second, or third output nodes, and generates first and second monitoring circuitry outputs. The circuit further includes an error correction circuit that produces an error correction output based on the first and second monitoring circuitry outputs. Accordingly, the monitoring circuitry generates first and second updated monitoring circuitry outputs based on the error correction output. The first and second updated monitoring circuitry outputs are logically combined using a logic circuit to reset the signal that has passed through the loop.

According to other embodiments, circuitry includes a ring oscillator circuit having first, second, and third output nodes. Each of the first, second, and third output nodes taps a signal that has passed through the ring oscillator circuit. The circuitry further includes error detection circuitry that detects an error event in the signal through the first, second, and third output nodes, and an error correction circuit that selectively resets the ring oscillator circuit in response to the detected error event in the signal. The error detection circuitry generates first and second error detection circuit outputs indicating whether the error event has occurred between the first, second, and third output nodes.

According to further embodiments, a method for detecting and correcting error events in an integrated circuit is disclosed. The method includes monitoring error effects associated with a signal that propagates through a ring oscillator with error detection circuitry. The error detection circuitry detects at least one error condition from first, second, or third output nodes of the ring oscillator. The method further includes correcting the error effects associated with the signal when the error condition is detected in either the first output node, the second output node, or the third output node of the ring oscillator with an error correction circuit coupled to the error detection circuitry.

Further features of the present invention, its nature, and various advantages, will be more apparent from the accompanying drawings and the following detailed description of the preferred embodiments.

DETAILED DESCRIPTION

The embodiments provided herein include techniques for detecting and correcting errors in a ring oscillator. Ring oscillators may be provided on integrated circuits such as digital signal processors, programmable logic device integrated circuits, microprocessors, application specific integrated circuits, or other integrated circuits.

In some situations, ring oscillators are incorporated into a circuit design. For example, a ring oscillator may be used as part of a clock signal generator. As another example, a ring oscillator may be used in a delay-locked-loop-type circuit. It should be noted that these are merely illustrative examples. Ring oscillators may be used in any suitable integrated circuit application.

However, ring oscillators are prone to generating harmonic frequencies. Harmonic frequencies can be triggered at power-on, by voltage supply noise, and by single event transients (SETs), which may result in noise spikes or other undesirable signal characteristics in the ring oscillators. If care is not taken, a noisy oscillator signal can cause a ring oscillator to oscillate at an undesirable higher-order harmonic frequency, rather than its intended frequency. This effect can cause a circuit that is based on the ring oscillator to operate improperly.

Figure 1:
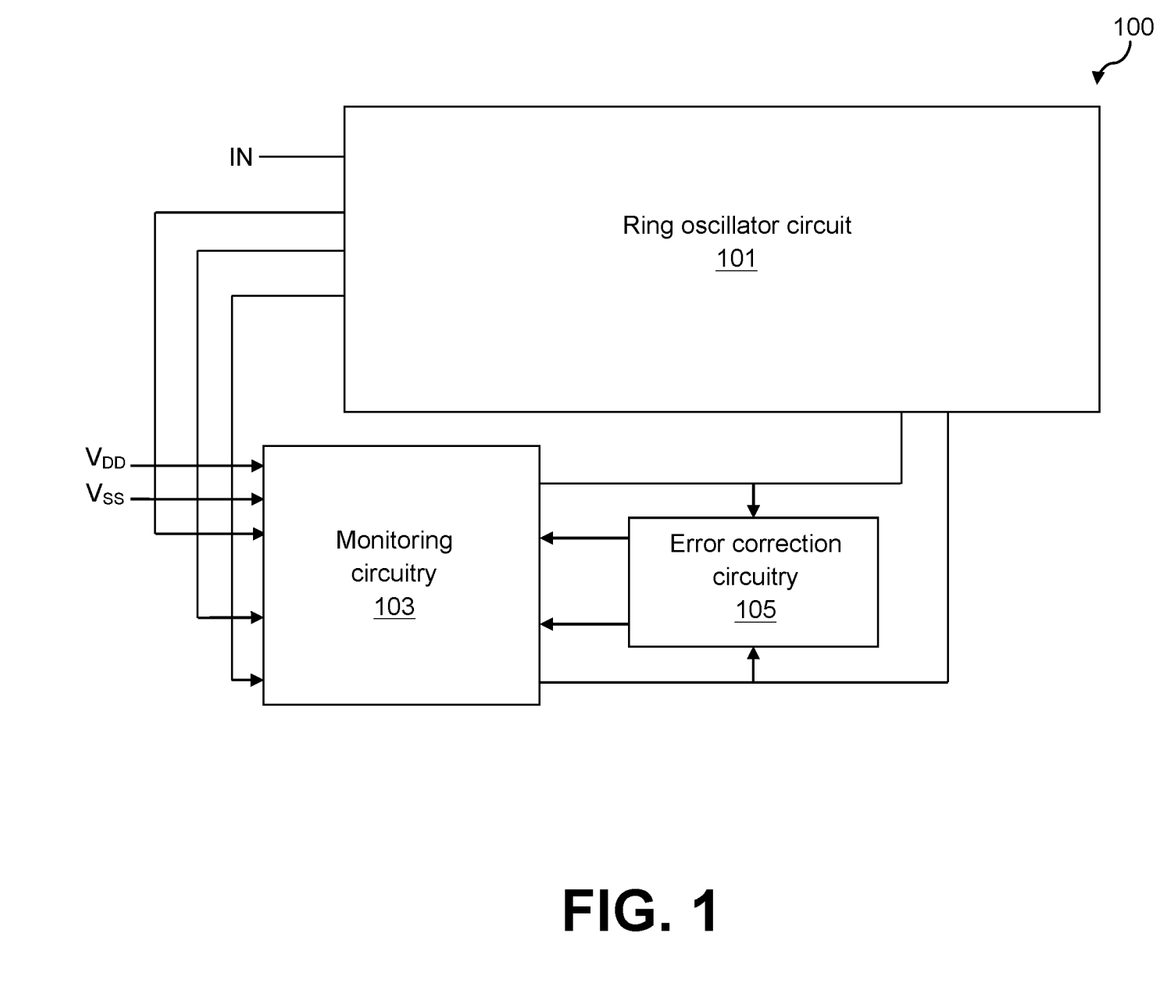
FIG. 1 shows a block diagram of an illustrative ring oscillator circuit having error detection and error correction circuitry in accordance with an embodiment of the present invention.

To avoid these problems, a ring oscillator with error detection and correction circuitry may be provided. An illustrative integrated circuit in which a ring oscillator circuit has circuitry for detecting and correcting errors is shown in FIG. 1. As illustrated, integrated circuit 100 includes ring oscillator circuit 101, monitoring circuitry 103, and error correction circuitry 105. Ring oscillator circuit 101 may couple to monitoring circuitry 103 and error correction circuitry 105. Monitoring circuitry 103 is connected to power supplies $V_{DD}$ and $V_{SS}$. For example, the power supplies $V_{DD}$ and $V_{SS}$ may be provided from a power supply generation unit (not shown) on integrated circuit 100. Power supply $V_{DD}$ may be a power supply having a higher potential than power supply $V_{SS}$, and monitoring circuitry 103 and integrated circuit 100 may receive power from the power supplies $V_{DD}$ and $V_{SS}$ to operate.

In one embodiment, monitoring circuitry 103 may monitor error events in an input trigger signal (e.g., IN signal) that has passed through ring oscillator circuit 101. In response to the error events, error correction circuitry 105 may selectively reset the IN signal that has passed through ring oscillator circuit 101. The error events may be, for example, harmonic error events. In one embodiment, monitoring circuitry 103 and error correction circuitry 105 may collectively be referred to as error detection and correction circuitry. A more detailed description of monitoring circuitry 103 and error correction circuitry 105 will be described below with reference to FIG. 2.

Figure 2:
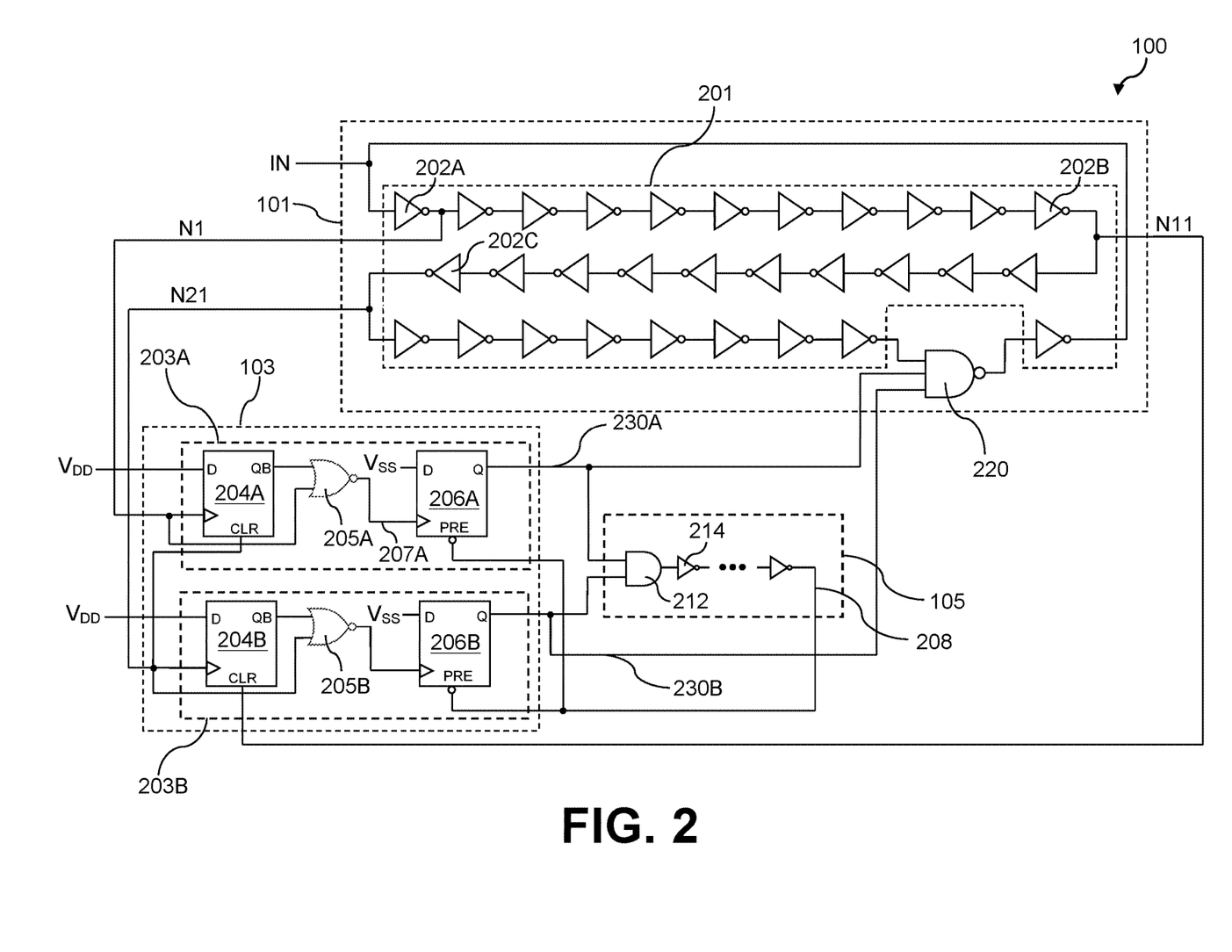
FIG. 2 is a circuit diagram of the illustrative ring oscillator circuit of FIG. 1 in accordance with one embodiment of the present invention.

FIG. 2 is a circuit diagram of illustrative integrated circuit 100 of FIG. 1 in accordance with one embodiment of the present invention. As described above, integrated circuit 100 includes ring oscillator circuit 101. Ring oscillator circuit 101 may include simple inverting logic circuits as stages. For example, a group of inverters (highlighted in region 201) are connected in a loop (or a ring) so that the output of each inverter feeds into the input of a successive inverter in the loop. The inverters may be, for example, CMOS inverter circuits or other types of inverter circuits. A 3-input NAND gate circuit 220 may be interposed in the loop. In this example, ring oscillator circuit 101 may be configured to operate as a 31-stage ring oscillator circuit. However, it should also be appreciated that ring oscillator circuits having a different number of circuit stages may be used for the present invention.

When integrated circuit 100 is powered and operational, an input trigger signal (e.g., IN signal) that is injected into ring oscillator circuit 101 may propagate (or oscillate) through the ring at a predetermined frequency. In order to detect error events that occur in the oscillating signal, ring oscillator circuit 101 may be tapped at different stages (e.g., the output nodes of inverters 202A, 202B, and 202C) using monitoring circuitry 103. Monitoring circuitry 103 may be implemented to serve as error detection circuitry for monitoring and detecting error events in ring oscillator circuit 101 based on the tapped output node signals (e.g., output node signals N1, N11, and N21) from the output nodes of inverters 202A, 202B, and 202C. It is noted that monitoring circuitry 103 and error detection circuitry 103 are used interchangeably in the description and have the same meaning In the embodiment shown in FIG. 2, error detection circuitry 103 includes two parallel error detection circuits 203A and 203B. Error detection circuit 203A may detect an error signal if the error event occurs between an output node of inverter 202A and an output node of inverter 202C. Error detection circuit 203B may detect another error signal that indicates that the error event has occurred between an output node of inverter 202B and an output node of inverter 202C. Still in FIG. 2, each of error detection circuits 203A and 203B may include two register circuits. For example, error detection circuit 203A includes register circuits 204A and 206A, and error detection circuit 203B includes register circuits 204B and 206B. In a preferred embodiment, register circuits 204A, 204B, 206A, and 206B are D-type register circuits.

As an example, in error detection circuit 203A, the D input of register circuit 204A is tied to power supply $V_{DD}$, and a clock input of register circuit 204A is coupled to an output node of inverter 202A. The QB-output of register circuit 204A and the output node of inverter 202A are gated to NOR gate 205A. A CLR input is used to clear register circuit 204A. In a preferred embodiment, CLR is active high. The CLR input of register circuit 204A is controlled by output node signal N21 from the output node of inverter 202C. The D input of register circuit 206A is tied to power supply $V_{SS}$, and a clock input of register circuit 206A is coupled to the output 207A of NOR gate 205A. The Q-output of register circuit 206A is coupled to an input of error correction circuitry 105. An inverting PRE input is used to preset register circuit 206A. The inverting PRE input of register circuit 206A is controlled using an output (e.g., error correction output 208) of error correction circuitry 105. In error detection circuit 203B, the clock input of register circuit 204B is coupled to an output node of inverter 202C, and the QB-output of register circuit 204B and the output node of inverter 202C are gated to NOR gate 205B. A CLR input of register circuit 204B is controlled by output node signal N11 of inverter 202B. In response to a rising edge in the signal at the CLR input of each register circuit 204A-204B, the signal at the QB-output of that register circuit is driven to a logic high state. The D-input of register circuit 204B is tied to power supply $V_{DD}$. The D input of register circuit 206B is tied to power supply $V_{SS}$, and a clock input of register circuit 206B is coupled to the output of NOR gate 205B. The Q-output of register circuit 206B is coupled to another input of error correction circuitry 105. The inverting PRE input of register circuit 206B is coupled to the output 208 of error correction circuitry 105. The PRE input of each register circuit 206A-206B is active low, meaning that the Q output of each register circuit is preset to a logic high state in response to a falling edge in the signal at its PRE input.

In some embodiments, error correction circuitry 105 may be referred to as a delay circuit. For example, as shown in FIG. 2, error correction circuitry 105 may include AND gate 212 having inputs coupled to the Q-outputs of registers 206A-206B and an output that couples to an input of an inverter chain having an even number of inverters that includes inverter circuit 214. Inverter circuit 214 may be part of a group of inverters that are serially connected. Error correction circuitry 105 receives error detection circuit outputs 230A and 230B as inputs and generates error correction output 208 at the output of the last inverter circuit in the chain of inverters. Error correction output 208 may control the inverting PRE inputs of register circuit 206A of error detection circuit 203A and register circuit 206B of error detection circuit 203B to produce updated error detection circuit outputs 230A and 230B.

In response to one of error detection circuits 203A or 203B detecting an error signal in ring oscillator circuit 101 as described above, the error detection circuit 203A or 203B that detects the error signal adjusts the logic state of its respective error detection circuit output 230A or 230B. In response to the logic state of either one of error detection circuit outputs 230A or 230B being adjusted by the respective error detection circuit 203A or 203B, error correction circuitry 105 triggers an error correction operation. During the error correction operation, error correction circuitry 105 adjusts the logic state of error correction output 208. In response to the adjustment in the logic state of error correction output 208, the error detection circuit 203A or 203B that detected the error signal adjusts the logic state of its output again to generate a respective updated error detection circuit output 230A or 230B. Subsequently, the resulting updated error detection circuit outputs 230A and 230B are logically combined by NAND gate 220 to reset the IN signal that has passed through the loop. In one embodiment, the IN signal, after being reset, may represent an initial logic state of the IN signal during an initialization phase of integrated circuit 100. This assures an error-free oscillation of the IN signal in ring oscillator circuit 101. For example, the initial logic state of the IN signal is at a logic value of "1".

Figure 3:
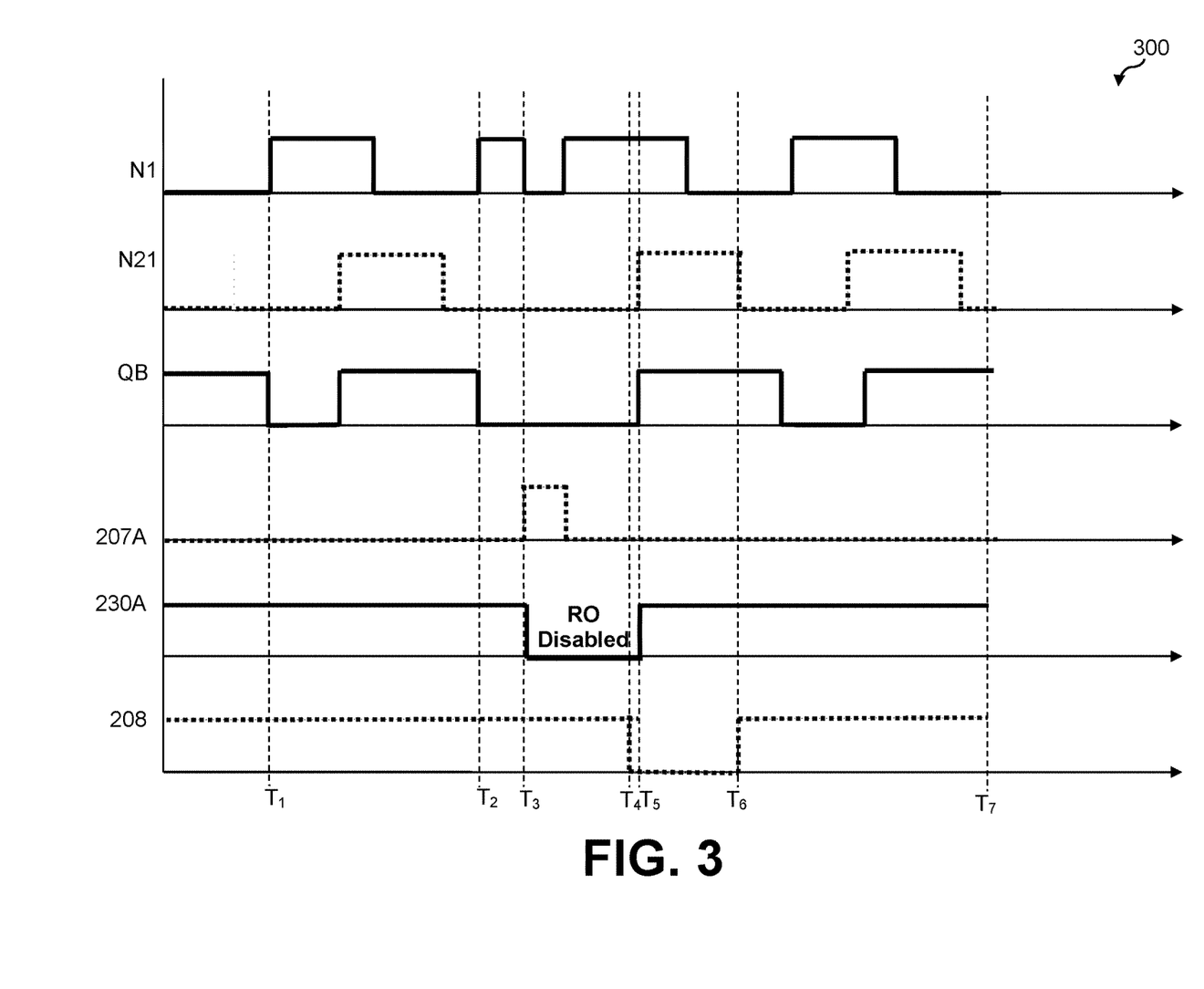
FIG. 3 is a timing diagram illustrating the behavior of signals during operation of error detection and correction circuitry on a ring oscillator circuit in accordance with one embodiment of the present invention.

FIG. 3 is a timing diagram 300 illustrating the behavior of some of the signals in the circuitry of FIGS. 1 and 2 in accordance with one embodiment of the present invention. It should be appreciated that the embodiments of FIGS. 1 and 2 may be used as examples to describe the timing diagram 300. As shown, timing diagram 300 illustrates the output node signal of inverter 202A (e.g., output node signal N1), output node signal of inverter 202C (e.g., output node signal N21), output signal of register circuit 204A (e.g., signal QB), output signal of NOR gate 205A (e.g., signal 207A), error detection circuit output 230A, and error correction output 208.

When integrated circuit 100 is powered and operational, an input trigger signal (e.g., IN signal) that is injected into integrated circuit 100 may propagate or oscillate through ring oscillator circuit 101 at a predetermined frequency, as shown by output node signals N1 and N21 between times $T_1$ and $T_2$. When an error event (i.e., harmonic-induced error) is triggered within ring oscillator circuit 101, error detection circuit 203A may detect the location of the error event in ring oscillator circuit 101 by tapping output node signal N1 at the output node of inverter 202A and the output node signal N21 at the output node of inverter 202C. If an error event occurs between the output nodes of inverters 202A and 202C, a rising edge (i.e., the change from a logic low state to a logic high state) occurs in signal N1 followed by a falling edge in signal N1 without an intervening rising edge occurring in signal N21. This scenario is illustrated in FIG. 3 which shows a rising edge in output node signal N1 at time $T_2$ and falling edge in signal N1 at time $T_3$ without an intervening rising edge in signal N21 occurring between these two edges in signal N1. In response to the rising edge in signal N1 at time $T_2$, signal N1 triggers register circuit 204A to latch power supply $V_{DD}$ and to generate a falling edge at its inverting QB-output at time $T_2$. The QB-output of register circuit 204A and output node signal N1 are gated to NOR gate 205A.

In response to the QB-output of register circuit 204A and output node signal N1, NOR gate 205A generates signal 207A, which is provided to register circuit 206A as a clock input. In response to the falling edge in signal N1 at time $T_3$ and the logic low level state at the QB-output of register circuit 204A, NOR gate 205A generates a rising edge in signal 207A. Just after time $T_3$, register circuit 206A generates a falling edge in error detection circuit output 230A by latching power supply $V_{SS}$ to its Q output in response to the rising edge in signal 207A to indicate that the error event has occurred in ring oscillator circuit 101. For example, just after time $T_3$, error detection circuit output 230A is at the logic low level (e.g., "0"). In this situation, error detection circuit output 230A disables the operation of ring oscillator (RO) circuit 101 while output 230A is at the logic low level state.

Accordingly, error correction circuitry 105 receives error detection circuit output 230A and generates error correction output 208. As shown in timing diagram 300, a falling edge occurs in the error correction circuit output 208 to a logic low level (e.g., "0") at time $T_4$ in response to the falling edge in signal 230A at time $T_3$. In one embodiment, error correction output 208 may control the inverting PRE inputs of register circuit 206A of error detection circuit 203A and register circuit 206B of error detection circuit 203B to produce updated error detection circuit outputs 230A and 230B. For example, at time $T_5$, register circuit 206A generates a rising edge in the updated error detection circuit output 230A to a logic high level (e.g., "1") in response to the falling edge in output 208 at time $T_4$ presetting circuit 206A. Error correction circuitry 105 generates a rising edge in output 208 at time $T_6$ in response to the rising edge in output 230A a period of time after the rising edge in output 230A occurs.

In response to the rising edge in output 230A at time $T_5$, NAND gate 220 re-enables ring oscillator 101 to allow oscillations again. In this scenario, output 230A is logically combined by NAND gate 220 to reset the input trigger signal that has passed through ring oscillator circuit 101 for a period of time (e.g., at the time interval between $T_4$ and $T_6$). In one embodiment, the input trigger signal, after being reset, may represent an initial state of the input trigger signal during an initialization phase of integrated circuit 100. This assures an error-free oscillation of the input trigger signal in ring oscillator circuit 101, as shown by output node signals N1 and N21 at the time interval between $T_5$ and $T_7$.

Similar to the operation described above with respect to error detection circuit 203A, error detection circuit 203B may detect an error event in ring oscillator circuit 101. If an error event occurs between the output nodes of inverters 202B and 202C, a rising edge occurs in signal N21 followed by a falling edge in signal N21 without an intervening rising edge occurring in signal N11. Circuit 203B generates a falling edge in error detection circuit output 230B in response to detecting this error event. The operation of ring oscillator circuit 101 is disabled while output 230B is at the logic low state. In response to the falling edge in output 230B, error correction circuitry 105 generates a falling edge in output 208 after the delay of circuitry 105. In response to the falling edge in output 208, a rising edge is generated in output 230B, which causes a subsequent rising edge in output 208. The rising edge in output 230B re-enables ring oscillator circuit 101.

Figure 4:
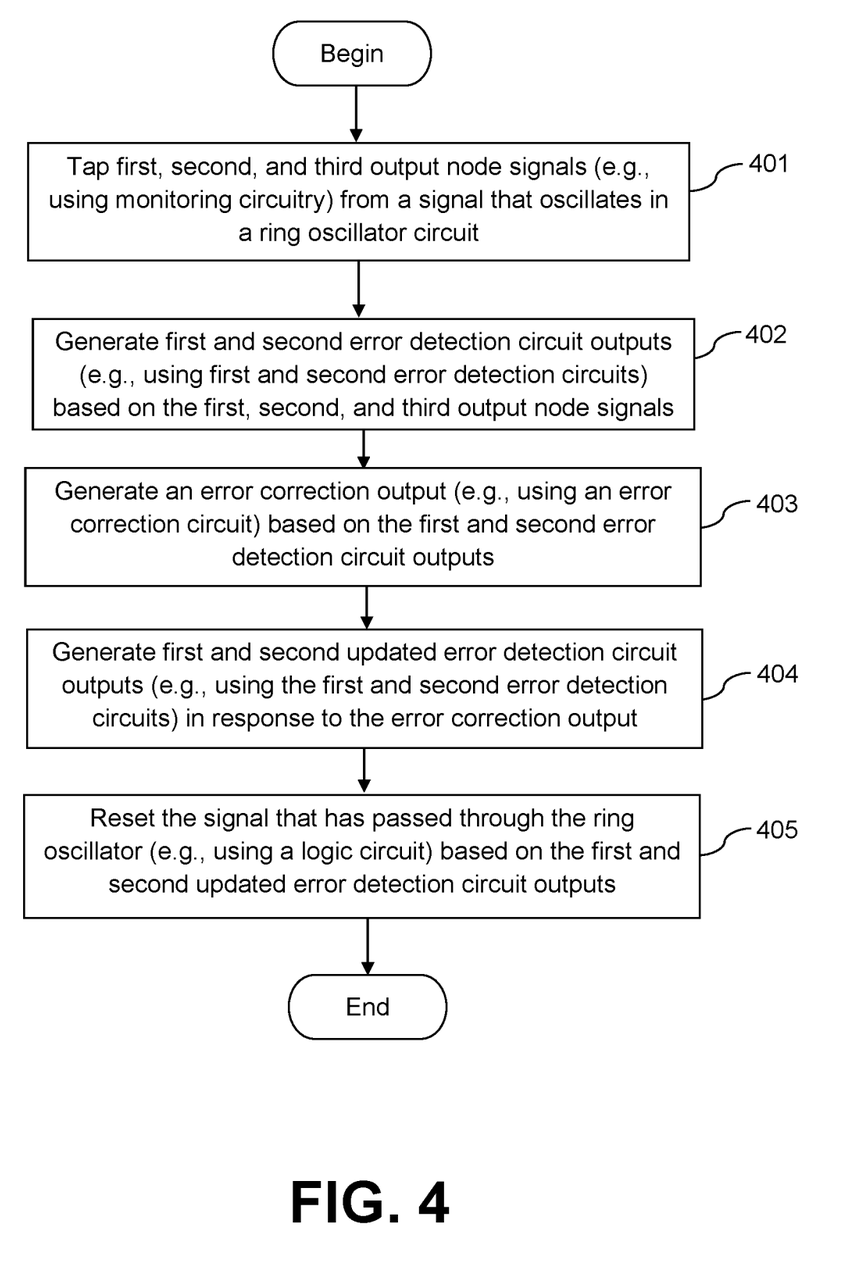
FIG. 4 is a flow chart of illustrative steps for detecting and correcting errors on an integrated circuit in accordance with one embodiment of the present invention.

FIG. 4 is a flow chart of illustrative steps for detecting and correcting errors on an integrated circuit in accordance with one embodiment of the present invention. It should be appreciated that the embodiments of FIGS. 1 and 2 may be used as examples implemented by the steps described below.

At step 401, first, second, and third output node signals are tapped from a signal that oscillates in a ring oscillator circuit using monitoring circuitry. For example, referring to FIGS. 1 and 2, when integrated circuit 100 is powered and operational, an input trigger signal (e.g., IN signal) that is injected into ring oscillator circuit 101 may oscillate through the ring at a predetermined frequency. In order to detect error events that occur in the input trigger signal, ring oscillator circuit 101 may be tapped at different circuit stages (e.g., inverters 202A, 202B, and 202C) using monitoring circuitry 103. For example, error detection circuit 203A of monitoring circuitry 103 may detect an error signal if an error event occurs between the output node of inverter 202A and the output node of inverter 202C, as described above. Similarly, error detection circuit 203B of monitoring circuitry 103 may detect another error signal that indicates that an error event has occurred between the output node of inverter 202B and the output node of inverter 202C, as described above.

At step 402, first and second error detection circuit outputs are generated based on the first, second, and third output node signals using first and second error detection circuits. For example, as shown in FIG. 2, error detection circuit 203A may output error detection circuit output 230A in response to the error signal that is detected based on output node signals N1 and N21, and error detection circuit 203B may output error detection circuit output 230B in response to the another error signal that is detected based on output node signals N11 and N21.

At step 403, an error correction output is generated based on the first and second error detection circuit outputs using an error correction circuit. Referring to FIG. 2, error correction circuitry 105 receives error detection circuit outputs 230A and 230B from the respective error detection circuits 203A and 203B as inputs and generates error correction output 208. In one embodiment, when any of error detection circuit outputs 230A and 230B is asserted (e.g., its logic state changes), this event may trigger an error correction operation in error correction circuitry 105. In this scenario, error correction circuitry 105 may generate error correction output 208. For example, error correction circuitry 105 may adjust the logic state of output 208 in response to a change in the logic state of output 230A or 230B. In one embodiment, error correction output 208 may control the inverting PRE inputs of register circuit 206A of error detection circuit 203A and register circuit 206B of error detection circuit 203B to produce updated error detection circuit outputs 230A and 230B at step 404.

At step 405, the signal that has passed through the ring oscillator is reset based on the first and second updated error detection circuit outputs using a logic circuit. For example, as shown in FIG. 2, the resulting updated error detection circuit outputs 230A and 230B of error detection circuits 203A and 203B are logically combined by a logic circuit (e.g., NAND gate 220) to reset the IN signal that has passed through the loop. The IN signal, after being reset, may represent an initial state of the IN signal during a power up operation of an initialization phase of integrated circuit 100. This assures an error-free oscillation of the IN signal in ring oscillator circuit 101.

The present exemplary embodiments may be practiced without some or all of these specific details described with reference to the respective embodiments. In other instances, well-known operations have not been described in detail in order not to obscure unnecessarily the present embodiments.

The methods and apparatuses described herein may be incorporated into any suitable circuit. For example, the methods and apparatuses may be incorporated into numerous types of devices such as microprocessors or other integrated circuits. Exemplary integrated circuits include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), and microprocessors, just to name a few.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

What is claimed is:

1. A circuit comprising:
a ring oscillator circuit comprising inverting logic circuits coupled in a loop, wherein the inverting logic circuits comprise first, second, and third output nodes;
a first error detection circuit comprising a first register circuit, wherein a first input of the first register circuit is coupled to the first output node, and wherein a second input of the first register circuit is coupled to the third output node; and
a second error detection circuit comprising a second register circuit, wherein a first input of the second register circuit is coupled to the second output node, and wherein a second input of the second register circuit is coupled to the third output node,
wherein the first or second error detection circuit resets a signal that has passed through the inverting logic circuits in response to detecting an error event in the signal from one of the first, second, or third output nodes.

2. The circuit of claim 1, wherein the first error detection circuit further comprises a third register circuit and a first logic gate circuit, wherein the first logic gate circuit is coupled to the first output node and to an output of the first register circuit, and wherein the third register circuit is coupled to an output of the first logic gate circuit.

3. The circuit of claim 2, wherein the second error detection circuit further comprises a fourth register circuit and a second logic gate circuit, wherein the second logic gate circuit is coupled to the third output node and to an output of the second register circuit, and wherein the fourth register circuit is coupled to an output of the second logic gate circuit.

4. The circuit of claim 3, wherein the ring oscillator circuit further comprises a third logic gate circuit coupled between two of the inverting logic circuits in the loop, wherein an output of the third register circuit is coupled to a first input of the third logic gate circuit, and wherein an output of the fourth register circuit is coupled to a second input of the third logic gate circuit.

5. The circuit of claim 1 further comprising:
an error correction circuit that generates an error correction output based on outputs of the first and second error detection circuits.

6. The circuit of claim 5, wherein the first error detection circuit generates a first updated error detection circuit output in response to the error correction output, and wherein the second error detection circuit generates a second updated error detection circuit output in response to the error correction output.

7. The circuit of claim 5, wherein the first error detection circuit further comprises a third register circuit that is coupled to an output of the error correction circuit that generates the error correction output.

8. The circuit of claim 7, wherein the second error detection circuit further comprises a fourth register circuit that is coupled to the output of the error correction circuit that generates the error correction output.

9. The circuit of claim 8, wherein the ring oscillator circuit further comprises a logic gate circuit coupled between two of the inverting logic circuits in the loop, wherein an output of the third register circuit is coupled to a first input of the logic gate circuit, and wherein an output of the fourth register circuit is coupled to a second input of the logic gate circuit.

10. A circuit comprising:
a ring oscillator circuit comprising inverting logic circuits coupled in a loop, wherein the inverting logic circuits comprise first, second, and third output nodes;
a first error detection circuit coupled to the first and third output nodes, wherein the first error detection circuit comprises a first register circuit;
a second error detection circuit coupled to the second and third output nodes, wherein the second error detection circuit comprises a second register circuit; and
an error correction circuit coupled to outputs of the first and second register circuits, wherein an output of the error correction circuit is coupled to an input of the first register circuit and to an input of the second register circuit,
wherein the first or second error detection circuit resets a signal that has passed through the inverting logic circuits in response to detecting an error event in the signal from one of the first, second, or third output nodes.

11. The circuit of claim 10, wherein the first error detection circuit further comprises a third register circuit coupled to the first and third output nodes, and wherein the second error detection circuit further comprises a fourth register circuit coupled to the second and third output nodes.

12. The circuit of claim 11, wherein the first error detection circuit further comprises a first logic gate circuit coupled between the first register circuit and the third register circuit, and wherein the second error detection circuit further comprises a second logic gate circuit coupled between the second register circuit and the fourth register circuit.

13. The circuit of claim 10, wherein the ring oscillator circuit further comprises a logic gate circuit coupled between two of the inverting logic circuits in the loop, wherein an output of the first register circuit is coupled to a first input of the logic gate circuit, and wherein an output of the second register circuit is coupled to a second input of the logic gate circuit.

14. The circuit of claim 10, wherein the output of the error correction circuit is coupled to a preset input of the first register circuit and to a preset input of the second register circuit.

15. The circuit of claim 10, wherein the error correction circuit comprises:
a logic gate circuit coupled to the outputs of the first and second register circuits; and
serially connected inverter circuits that are coupled to an output of the logic gate circuit and to the inputs of the first and second register circuits.

16. A circuit comprising:
a ring oscillator circuit comprising inverting logic circuits coupled in a loop, wherein the inverting logic circuits comprise first, second, and third output nodes;
a first error detection circuit comprising a first register circuit and a first logic gate circuit, wherein the first register circuit is coupled to the first and third output nodes, and wherein the first logic gate circuit is coupled to the first output node and to an output of the first register circuit; and
a second error detection circuit comprising a second register circuit and a second logic gate circuit, wherein the second register circuit is coupled to the second and third output nodes, and wherein the second logic gate circuit is coupled to the third output node and to an output of the second register circuit,
wherein the first or second error detection circuit resets a signal that has passed through the inverting logic circuits in response to detecting an error event in the signal from one of the first, second, or third output nodes.

17. The circuit of claim 16, wherein the first error detection circuit further comprises a third register circuit coupled to an output of the first logic gate circuit.

18. The circuit of claim 17, wherein the second error detection circuit further comprises a fourth register circuit coupled to an output of the second logic gate circuit.

19. The circuit of claim 18, wherein the ring oscillator circuit further comprises a third logic gate circuit coupled between two of the inverting logic circuits in the loop, wherein an output of the third register circuit is coupled to a first input of the third logic gate circuit, and wherein an output of the fourth register circuit is coupled to a second input of the third logic gate circuit.

20. The circuit of claim 16 further comprising:
an error correction circuit that generates an error correction output based on outputs of the first and second error detection circuits,
wherein the first error detection circuit further comprises a third register circuit coupled to an output of the first logic gate circuit, and wherein the third register circuit generates a first updated error detection circuit output in response to the error correction output, and
wherein the second error detection circuit further comprises a fourth register circuit coupled to an output of the second logic gate circuit, and wherein the fourth register circuit generates a second updated error detection circuit output in response to the error correction output.

* * * * *